US011801752B2

(12) United States Patent
Carvalho et al.

(10) Patent No.: US 11,801,752 B2
(45) Date of Patent: Oct. 31, 2023

(54) MOTOR VEHICLE CONTROL DEVICE

(71) Applicant: BCS AUTOMOTIVE INTERFACE SOLUTIONS GMBH, Radolfzell (DE)

(72) Inventors: Nelson Carvalho, Aach (DE); Pawel Borowczyk, Czestochowa (PL); Steffen Sornberger, Hilzingen/Twiefeld (DE); Helmut Sowig, Villingen-Schwenningen (DE); Leandro Conde, Singen (DE); Viktor Beliuzhenko, Constance (DE)

(73) Assignee: BCS AUTOMOTIVE INTERFACE SOLUTIONS GMBH, Radolfzell (DE)

( * ) Notice: Subject to any disclaimer, the term of this patent is extended or adjusted under 35 U.S.C. 154(b) by 183 days.

(21) Appl. No.: 16/623,522

(22) PCT Filed: Jun. 20, 2018

(86) PCT No.: PCT/EP2018/066367
§ 371 (c)(1),
(2) Date: Dec. 17, 2019

(87) PCT Pub. No.: WO2018/234360
PCT Pub. Date: Dec. 27, 2018

(65) Prior Publication Data
US 2020/0139816 A1    May 7, 2020

(30) Foreign Application Priority Data

Jun. 21, 2017   (DE) ..................... 10 2017 113 658.4

(51) Int. Cl.
*B60K 37/06* (2006.01)
*H03K 17/96* (2006.01)

(52) U.S. Cl.
CPC .......... *B60K 37/06* (2013.01); *H03K 17/962* (2013.01); *B60K 2370/1446* (2019.05);
(Continued)

(58) Field of Classification Search
CPC ........ H03K 2217/96062; H03K 2217/960755; H03K 2217/960785; H03K 17/962; H03K 17/96; B60K 2370/1446; B60K 2370/158; B60K 2370/42; B60K 37/06; H01H 3/00; H01H 3/02; H01H 3/0213; H01H 23/00; H01H 23/24; H01H 25/00; H01H 25/06; G06F 2203/00; G06F 2203/04104;
(Continued)

(56) References Cited

U.S. PATENT DOCUMENTS 3,848,952 A *  11/1974  Tighe, Jr. ............... H01R 12/83
                                                        439/326
6,347,044 B1 *  2/2002  Won ....................... H05K 7/142
                                                        361/810

(Continued)

FOREIGN PATENT DOCUMENTS

WO        2016189017        12/2016

*Primary Examiner* — Anthony R Jimenez
(74) *Attorney, Agent, or Firm* — McNees Wallace & Nurick LLC

(57) ABSTRACT

A motor vehicle control device, comprising an outer housing part, a control unit including a control surface and a printed circuit board which is carried by a circuit board carrier that is at least partly accommodated and floatingly mounted in the outer housing part.

16 Claims, 2 Drawing Sheets

(52) U.S. Cl.
CPC .... *B60K 2370/158* (2019.05); *B60K 2370/42* (2019.05); *H03K 2217/96062* (2013.01); *H03K 2217/960755* (2013.01); *H03K 2217/960785* (2013.01)

(58) Field of Classification Search
CPC . G06F 3/00; G06F 3/041; G06F 3/044; H01R 11/00
USPC .......................................................... 701/36
See application file for complete search history.

(56) References Cited

U.S. PATENT DOCUMENTS

| | | | | |
|---|---|---|---|---|
| 8,013,233 | B2* | 9/2011 | Komatsu | G10H 1/346 84/724 |
| 8,144,453 | B2* | 3/2012 | Brown | G02F 1/133526 345/173 |
| 8,581,981 | B2* | 11/2013 | Alley | H04N 7/185 348/402.1 |
| 8,760,878 | B2* | 6/2014 | Lostoski | H05K 7/1481 361/752 |
| 8,786,554 | B2* | 7/2014 | Hristov | G06F 3/0416 345/173 |
| 10,277,225 | B2 | 4/2019 | Korherr | |
| 2006/0079122 | A1* | 4/2006 | Matias | G06F 3/039 439/502 |
| 2010/0238053 | A1 | 9/2010 | Schmidt et al. | |
| 2016/0035504 | A1* | 2/2016 | Bleckmann | H01H 23/24 200/4 |
| 2016/0315612 | A1 | 10/2016 | Fust et al. | |
| 2017/0108931 | A1* | 4/2017 | Gregorio | G06F 3/016 |

* cited by examiner

MOTOR VEHICLE CONTROL DEVICE

RELATED APPLICATIONS

This application filed under 35 U.S.C § 371 is a national phase application of International Application Number PCT/EP2018/066367, filed Jun. 20, 2018, which claims the benefit of German Application No. 10 2017 113 658.4 filed Jun. 21, 2017, the subject matter of which are incorporated herein by reference in their entirety.

BACKGROUND

This invention relates to a motor vehicle control device which is used in a motor vehicle, in order to operate functions of the motor vehicle.

From the prior art different motor vehicle control devices are known, which are used at different points in a motor vehicle. For example, there are known motor vehicle control devices which include illuminated switching or control elements, so that a vehicle occupant can easily find the corresponding control elements also in the dark. Such motor vehicle control devices also are referred to as light strips or light islands.

The motor vehicle control devices used today usually include a capacitive control element, so that the approach to and/or the touch of the control surface by a vehicle occupant, in particular his/her finger, is detected and an associated function is executed. This becomes possible via corresponding capacitive touch sensors which form a capacitor between a printed circuit board and a control surface. Formerly, mechanical switches were provided for operating corresponding functions, which however had a higher wear.

Due to the previously mechanical switches, the vehicle occupants are used to the fact that a control element has a haptic, i.e. mechanical feedback when the corresponding control element has been actuated. In the case of the mechanical switch this usually was the required switching path at whose end snap-in also was possible. As the capacitive control elements per se do not have such haptic feedback, it is known from the prior art to simulate the same.

For example, there is used an electromagnetic drive which generates a haptic feedback via the control element, in case the corresponding control element has been actuated. The haptic feedback can be effected in the form of a vibration of the motor vehicle control device, in particular of the corresponding control element.

In the motor vehicle control devices with haptic feedback as known from the prior art it was found to be disadvantageous, however, that the control surface is shifted relative to the printed circuit board, so that the capacitive touch sensors do not work properly, as for example an adjacent touch sensor has been actuated unintentionally.

SUMMARY

It is the object of the invention to provide an improved motor vehicle control device which ensures a reliable actuation.

According to the invention, this object is solved by a motor vehicle control device, comprising an outer housing part, a control unit including a control surface, and a printed circuit board which is carried by a circuit board carrier that is at least partly accommodated and floatingly mounted in the outer housing part.

It is the idea underlying the invention to mechanically decouple the printed circuit board from the outer housing part as far as possible, in that the circuit board carrier is floatingly mounted in the outer housing part. It thereby is ensured that the printed circuit board is precisely positioned with respect to the control unit, as the printed circuit board can move along with the control unit. In case the control unit is to be adjusted or moved due to a haptic actuator unit, the printed circuit board associated to the control unit likewise is moved, so that the relative position of the printed circuit board and the control unit always is ensured. This ensures that the control elements provided on a control surface of the control unit always are associated to the intended surfaces on the printed circuit board in the desired way, so that no unintentional operating errors occur.

As the circuit board carrier is floatingly mounted, the printed circuit board carried by the circuit board carrier is also floatingly mounted.

One aspect provides that the printed circuit board includes touch sensors, in particular wherein the touch sensors are of the capacitive type. Correspondingly, the motor vehicle control device is a capacitive motor vehicle control device which detects a touch of the control surface. In case the vehicle occupant touches the control unit, a stored function can be executed.

In particular, the touch sensors are formed such that they recognize an approach of a control object to the control surface. Thus, the touch sensors at the same time constitute capacitive approach sensors, which recognize the approach of the control object, for example of a finger or a hand, to the control surface, for example to a control element formed on the control surface. Accordingly, it is not necessary that the vehicle occupant touches the control surface, in order to execute an associated function. The approach to the control surface also can lead to the activation of a search illumination, which allows the vehicle occupant to more easily recognize a particular control element, in particular in the dark.

A further aspect provides a haptic actuator unit which comprises a haptic actuator, in particular wherein the haptic actuator constitutes an electromagnetic drive. The haptic actuator accordingly can electrically be driven by the printed circuit board, in particular by a controller coupled with the printed circuit board, in order to generate a mechanical feedback via the control unit, which signals to the vehicle occupant that his/her input has been recognized.

A further aspect provides that the haptic actuator supports on an abutment surface provided on the outer housing part. The haptic actuator furthermore can be coupled with the circuit board carrier, so that a mechanical movement is transmitted to the circuit board carrier. The haptic actuator thereby moves the circuit board carrier relative to the outer housing part.

Furthermore, the control unit and the haptic actuator unit can be mechanically coupled with each other such that the control unit is movable via the haptic actuator, in particular relative to the outer housing part. The control unit is coupled with the haptic actuator unit via the circuit board carrier, so that the haptic actuator unit mechanically adjusts the circuit board carrier, the printed circuit board and the control unit likewise mounted on the circuit board carrier.

A further aspect provides that the haptic actuator is electrically connected with the printed circuit board without any cable. For example, a corresponding cutout is formed in the circuit board carrier, through which an electrical contact extends between the printed circuit board and the haptic actuator, in order to electrically couple the same with the printed circuit board. As the haptic actuator at least sectionally moves with the printed circuit board, when a haptic feedback is generated, it is ensured that the contact is not loaded. The electrical contact can be a pin of the haptic actuator, which correspondingly contacts the printed circuit board.

A further aspect provides that the circuit board carrier is floatingly mounted on the outer housing part, in particular via spring elements. The spring elements can be metal springs which with a first end each are attached to the outer housing part and with a second end to the corresponding circuit board carrier. The spring elements ensure the desired movement of the control unit relative to the outer housing part. In particular, it is ensured that the printed circuit board and the control unit equally are moved via the haptic actuator.

The outer housing part can have a connector opening for a connection plug. The connection plug is put into the motor vehicle control device from outside, in order to supply the internal components of the motor vehicle control device for example with electricity. At the same time, the connection plug also can comprise a control line with which the motor vehicle control device is coupled with a central control device of the motor vehicle, so that control signals can be received or output. The control line correspondingly is of the bidirectional type. In any case, the control line is formed such that signals can be sent from the motor vehicle control device to the central control device.

A further aspect provides that the circuit board carrier comprises a connector chamber which in the assembled condition of the motor vehicle control device is aligned with the connector opening. Correspondingly, the connection plug inserted into the connector opening can be accommodated in the connector chamber of the circuit board carrier. The connection plug usually comprises an at least partly flexible cable, so that the occurring mechanical movements of the circuit board carrier do not load the plug connection, in case the haptic actuator unit generates a haptic feedback.

A further aspect provides that contact pins of the printed circuit board extend into the connector chamber. In the connector chamber these contact pins can be contacted by the connection plug, in order to for example form the electrical connection of the motor vehicle control device, in particular its printed circuit board, with the central control device. The contact pins of the printed circuit board are moved via the haptic actuator unit in the same way as the connector chamber of the circuit board carrier, as the printed circuit board is held on the circuit board carrier, so that no relative movement occurs between the printed circuit board and the circuit board carrier.

In particular, the control unit is formed as a trim which comprises several switching symbols that include at least translucent, in particular transparent, portions. The translucent portions ensure that the corresponding switching symbols can be illuminated, so that a vehicle occupant will find the different control elements on the control unit. The switching symbols accordingly can be backlit. The corresponding control elements are associated to the switching symbols shown on the control surface.

According to one aspect, at least one light guiding element is associated to the control unit, in particular wherein the light guiding element is formed to be compressible. For example, several light guiding elements are associated to the control unit, which can direct different colors to the corresponding switching symbols, in particular to their translucent portions. The corresponding light guiding elements can be coupled with light seals which ensure that no unwanted interferences occur, i.e. the different colors intermix. As the light guiding elements are formed to be compressible, the vehicle occupant can actuate the corresponding switching symbols by depressing the associated areas of the control surface, as this is the case with a mechanical switching element. The user already receives a haptic feedback, as he/she compresses the light guiding element. The haptic actuator unit then can also produce a vibration or mechanical movement, in order to signal to the vehicle occupant that the actuation has been recognized. At the same time, the corresponding switching symbol can be illuminated, in order to indicate that the corresponding function associated to the switching symbol or the control element is activated. The light guiding element in particular is arranged between the control unit and the printed circuit board. This ensures that the printed circuit board is protected from too large an action of force, as the user compresses the light guiding element when actuating the control unit.

The motor vehicle control device in particular is a light island or a light strip. Such light adjusting devices usually are provided on the instrument panel of a motor vehicle, via which the vehicle operator can switch on or off the low beam, the high beam, a rear fog lamp or an automatic function. In addition, further adjustments can be made on the motor vehicle control device, such as the heating of the front or rear window. Consequently, the motor vehicle control device formed as light island or light strip can provide the functions required for the vision of the vehicle operator.

DESCRIPTION OF THE DRAWINGS

Further advantages and properties of the invention can be taken from the following description and the drawings to which reference is made. In the drawings.

DETAILED DESCRIPTION

Figure 1:
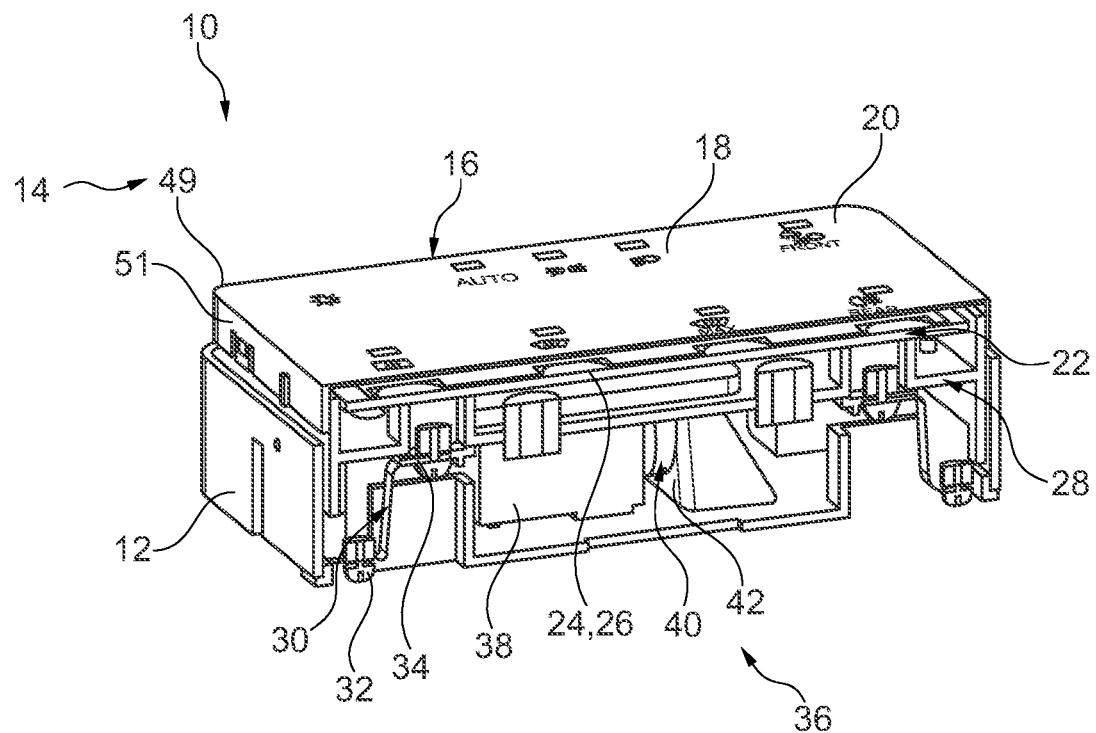
FIG. 1 shows a sectional view of a motor vehicle control device according to the invention in a first sectional plane.

FIG. 1 shows a motor vehicle control device 10 which is incorporated in a motor vehicle, for example in an instrument panel of the motor vehicle.

The motor vehicle control device 10 comprises an outer housing part 12 and a control unit 14 which together with the outer housing part 12 forms the outer surfaces of the motor vehicle control device 10.

In the installed condition of the motor vehicle control device 10 the outer housing part 12 is completely accommodated in a frame in the instrument panel of the motor vehicle, whereas the control unit 14 merely is laterally surrounded by a frame or a trim. The control surface 16 provided on the control unit 14 however is accessible for the vehicle occupants, in particular for the vehicle operator, so that the switching symbols 18 arranged on the control surface 16 can be actuated.

Beside the switching symbols 18 provided on the control surface 16 light exit surfaces 20 furthermore are provided on the control surface 16, as will yet be explained below.

Figure 2:
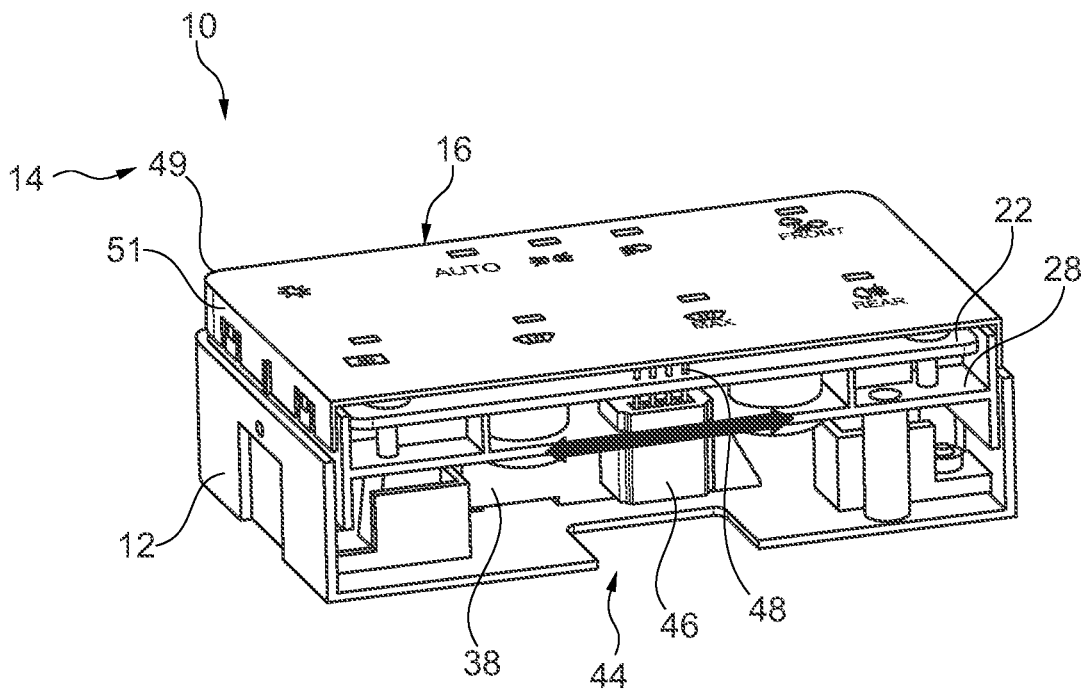
FIG. 2 shows a sectional representation of the motor vehicle control device according to FIG. 1 in another sectional plane.
Figure 3:
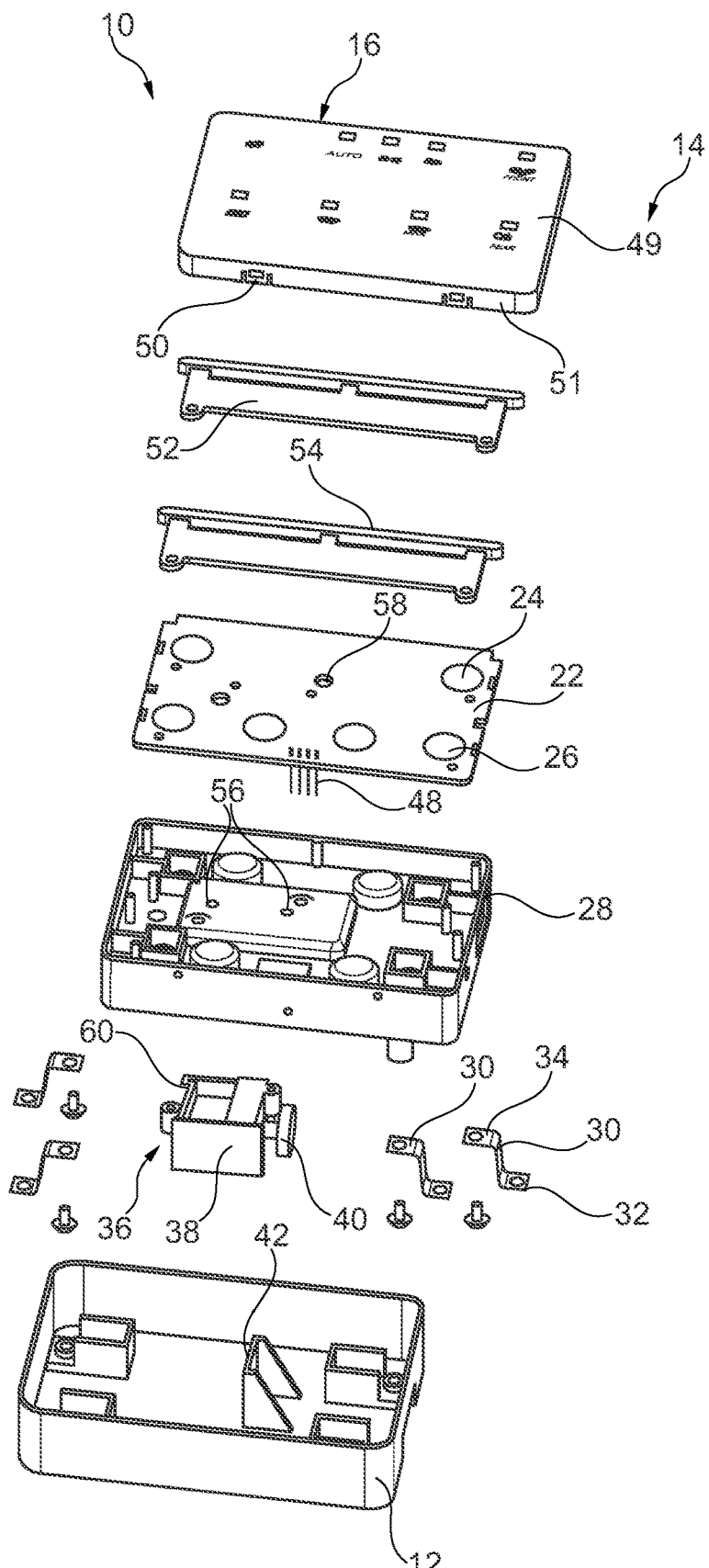
FIG. 3 shows an exploded view of the motor vehicle control device of FIGS. 1 and 2.

The sectional representations of FIGS. 1 and 2 as well as the exploded view of FIG. 3 reveal that the motor vehicle control device 10 comprises a printed circuit board 22 which is associated to the control unit 14. The printed circuit board 22 comprises touch sensors 24 which together with the control unit 14 form capacitive sensors. The touch sensors 24 can detect a touch of the control surface 16 by an actuating object, for example a finger of a vehicle occupant. The touch sensors 24 also can be formed as approach sensors 26 which detect an approach of an actuating object to the control surface 16.

The printed circuit board 22 is carried by a circuit board carrier 28 which is at least partly accommodated in the outer housing part 12.

The circuit board carrier 28 is floatingly mounted on the outer housing part 12, wherein for this purpose spring elements 30 are provided, which in the illustrated embodiment are formed as metal springs. The spring elements 30 with a first end 32 are firmly coupled to the outer housing part 12, in particular to an inside of the outer housing part 12, whereas via their second end 34 they are firmly coupled with the circuit board carrier 28, It thereby is possible that the circuit board carrier 28 as well as the printed circuit board 22 attached thereto can move relative to the outer housing part 12.

The relative movement can be initiated by a haptic actuator unit 36, which comprises a haptic actuator 38 that for example constitutes an electromagnetic drive.

The haptic actuator unit 36 furthermore comprises a rubber buffer 40 which rests against a corresponding abutment surface 42 on the outer housing part 12. During the operation of the haptic actuator unit 36 the haptic actuator 38 supports on the abutment surface 42 via the rubber buffer 40, in order to produce a relative movement of the circuit board carrier 28, the printed circuit board 22 attached thereto and the control unit 14 with respect to the outer housing part 12.

It can thereby be signaled to the vehicle occupant, who has operated the motor vehicle control device 10, that his/her actuation has been detected in that the control surface 16, which the vehicle occupant touches, is moved correspondingly, for example vibrates.

The direction of movement can extend parallel to the plane defined by the control surface 16, as can be taken from the arrows shown in FIG. 2.

The sectional view of FIG. 2 reveals that the outer housing part 12 comprises a connector opening 44 which is aligned with a connector chamber 46 that is formed on the circuit board carrier 28.

Contact pins 48 of the printed circuit board 22 extend into the connector chamber 46, in order to be coupled with a connection plug which is inserted into the connector opening 44 and the connector chamber 46 from outside. The motor vehicle control device 10 thereby is connected to the motor vehicle, so that a power supply and control is ensured. In particular, the control signals are transmitted from the motor vehicle control device 10 to a central control device of the motor vehicle, in order to execute the functions which correspond to the switching symbols 18 actuated on the control surface 16.

FIG. 3, in which the motor vehicle control device 10 is shown in an exploded view, reveals that the control unit 14 is formed as a trim 49 which via latching means 50 can be coupled with the circuit board carrier 28. Both the control unit 14 formed as trim 49 and the outer housing part 12 each are formed like a half shell, wherein as regards its dimensions the control unit 14 might be accommodated in the outer housing part 12, i.e. it is dimensioned slightly smaller, in order to provide for the relative movements.

In particular, the trim 49 has a circumferential collar portion 51 which partly is accommodated in the outer housing part 12 formed like a half shell (see FIG. 2). The collar portion 51 is arranged substantially at right angles to the control surface 16. On the collar portion 51 the latching means 50 also are arranged.

In addition, the motor vehicle control device 10 in the illustrated embodiment comprises two light guiding elements 52, which each include a light seal 54 on an associated side face. The light guiding elements 52 each are associated to different light sources 56 which for example emit different colors. The light sources 56 are arranged on the circuit board carrier 28, wherein the emitted light impinges on the light guiding elements 52 through an opening 58 in the printed circuit board 22.

The light emitted by the light sources 56 accordingly is distributed in the light guiding element 52, so that it can exit from the corresponding light exit surfaces 20 on the control unit 14.

In so far, the light sources 56 and the light guiding elements 52 form a search illumination which for example is activated when an approach of a touching object to the control surface 16 has been recognized.

The switching symbols 18 themselves can be backlit via separate, non-illustrated light sources, in case the corresponding function has been activated.

The light guiding elements 52 are arranged between the printed circuit board 22 and the control unit 14, wherein they are formed to be compressible, so that a vehicle occupant can depress the corresponding switching symbols 18, which are associated to corresponding control elements, in order to operate the correspondingly associated function. The light guiding element 52, which is arranged below the corresponding switching symbol 18, thereby is compressed. The light guiding elements 52 constitute a protection of the underlying printed circuit board 22, as they correspondingly absorb (at least in part) an excessively high actuating force. For example, the light guiding elements 52 are made of an optical silicone.

Furthermore, FIG. 3 reveals that the haptic actuator 38 includes a pin 60 which extends through an associated opening in the circuit board carrier 28, in order to directly contact the printed circuit board 22. In so far, the haptic actuator unit 36 is electrically connected with the printed circuit board 22 without any cable.

In case the haptic actuator unit 36 generates a haptic feedback, the haptic actuator 38 for the most part (except for the portion provided with the rubber buffer 40) moves with the circuit board carrier 29, the printed circuit board 22 and the control unit 14 relative to the stationary outer housing part 12. This ensures that the contact pins 48 of the printed circuit board 22 always have the same relative position with respect to the connector chamber 46, whereby the plug connection is not loaded.

In general, the motor vehicle control device 10 according to the illustrated embodiment is a light island which for example is arranged in the instrument panel of the motor vehicle beside the steering wheel. Alternatively, a light strip can be provided, in which the individual switching symbols 18 are arranged in one row.

The control unit 14 in particular can be manufactured as a two-component injection-molded part which at least partly is electrically conductive. This ensures that the control unit 14 together with the touch sensors 24 on the printed circuit board 22 can form the capacitive sensors.

In general it is ensured that the touch sensors 24 or the approach sensors 26 always are associated to the corresponding switching symbols 18, as the printed circuit board 22 together with the control unit 14 is mechanically moved via the haptic actuator unit 36, in particular to the left or right, i.e. in the plane which is defined by the control surface 16.

The invention claimed is:

1. A motor vehicle control device, comprising:
an outer housing part;
a control unit including a control surface; and
a printed circuit board facing the control surface which is carried by a circuit board carrier that is at least partly accommodated and floatingly mounted in the outer housing part, via separate spring elements,
wherein the floatingly mounted printed circuit board ensures that an orientation of the control surface of the control unit in its initial state is parallel to an orientation of the control surface of the control unit in its actuated state, and wherein the spring elements, via a respective first end, are firmly coupled to the outer housing part.

2. The motor vehicle control device according to claim 1, wherein the circuit board carrier floatingly mounted on the outer housing part.

3. The motor vehicle control device according to claim 1, wherein the control unit is formed as a trim which comprises several switching symbols which at least include translucent portions.

4. The motor vehicle control device according to claim 1, wherein the control unit includes at least one light guiding element.

5. The motor vehicle control device according to claim 1, wherein the motor vehicle control device is a light island or a light strip.

6. The motor vehicle control device according to claim 1, wherein the printed circuit board includes touch sensors.

7. The motor vehicle control device according to claim 6, wherein the touch sensors are formed to recognize an approach of a control object to the control surface.

8. The motor vehicle control device according to claim 1, wherein a haptic actuator unit is provided, which comprises a haptic actuator.

9. The motor vehicle control device according to claim 8, wherein the haptic actuator supports on an abutment surface provided on the outer housing part.

10. The motor vehicle control device according to claim 8, wherein the control unit and the haptic actuator unit are mechanically coupled with each other such that the control unit is movable via the haptic actuator.

11. The motor vehicle control device according to claim 8, wherein the haptic actuator is electrically connected with the printed circuit board without any cable.

12. The motor vehicle control device according to claim 1, wherein the outer housing part includes a connector opening for a connection plug.

13. The motor vehicle control device according to claim 12, wherein the circuit board carrier comprises a connector chamber which in an assembled condition of the motor vehicle control device is aligned with the connector opening.

14. The motor vehicle control device according to claim 13, wherein contact pins of the printed circuit board extend into the connector chamber.

15. A motor vehicle control device, comprising:
an outer housing part;
a control unit including a control surface; and
a printed circuit board which is carried by a circuit board carrier that is at least partly accommodated and floatingly mounted in the outer housing part,
wherein a haptic actuator unit is provided, which comprises a haptic actuator in the form of an electromagnetic drive that supports on an abutment surface provided on the outer housing part, wherein the circuit board carrier is floatingly mounted on the outer housing part via separate spring elements, and wherein the spring elements with a first end are firmly coupled to the outer housing part, and via their second end the spring elements are firmly coupled with the circuit board carrier.

16. A motor vehicle control device, comprising:
an outer housing part,
a control unit including a control surface; and
a printed circuit board which is carried by a circuit board carrier that is at least partly accommodated and floatingly mounted in the outer housing part via separate spring elements, wherein the spring elements, via a respective first end, are firmly coupled to the outer housing part,
wherein a haptic actuator unit is provided, which comprises a haptic actuator, and wherein the haptic actuator in the form of an electromagnetic drive is electrically connected with the printed circuit board without any cable.

* * * * *